US012651722B2

(12) United States Patent
DeLuca et al.

(10) Patent No.: US 12,651,722 B2
(45) Date of Patent: Jun. 9, 2026

(54) BLENDED ENERGY IMPLANT

(71) Applicant: Axcelis Technologies, Inc., Beverly, MA (US)

(72) Inventors: James S DeLuca, Beverly, MA (US); Dwight Roh, North Andover, MA (US); Patrick Heres, Boxford, MA (US); Atul Gupta, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 831 days.

(21) Appl. No.: 17/881,020

(22) Filed: Aug. 4, 2022

(65) Prior Publication Data

US 2023/0038392 A1 Feb. 9, 2023

Related U.S. Application Data

(60) Provisional application No. 63/229,663, filed on Aug. 5, 2021, provisional application No. 63/229,751, filed on Aug. 5, 2021.

(51) Int. Cl.
H01J 37/147 (2006.01)
C23C 14/48 (2006.01)
(Continued)

(52) U.S. Cl.
CPC .......... H01J 37/1474 (2013.01); C23C 14/48 (2013.01); C23C 14/54 (2013.01);
(Continued)

(58) Field of Classification Search
CPC ........ H01J 37/1474; H01J 37/08; H01J 37/20; H01J 37/304; H01J 37/3171;
(Continued)

(56) References Cited

U.S. PATENT DOCUMENTS

| | | |
|---|---|---|
| 4,980,562 A | 12/1990 | Berrian et al. |
| 5,091,655 A | 2/1992 | Dykstra et al. |

(Continued)

FOREIGN PATENT DOCUMENTS

WO 9908306 A1 2/1999

OTHER PUBLICATIONS

International Search Report dated Nov. 9, 2022 in connection with PCT/EP2022/039434.

*Primary Examiner* — Michael Maskell
(74) *Attorney, Agent, or Firm* — Eschweiler & Potashnik, LLC

(57) ABSTRACT

Ion implantation systems and methods implant varying energies of an ion beam across a workpiece in a serial single-workpiece end station, where electrodes of an acceleration/deceleration stage, bend electrode and/or energy filter control a final energy or path of the ion beam to the workpiece. The bend electrode or an energy filter can form part of the acceleration/deceleration stage or can be positioned downstream. A scanning apparatus scans the ion beam and/or the workpiece, and a power source provides varied electrical bias signals to the electrodes. A controller selectively varies the electrical bias signals concurrent with the scanning of the ion beam and/or workpiece through the ion beam based on a desired ion beam energy at the workpiece. A waveform generator can provide the variation and synchronize the electrical bias signals supplied to the acceleration/deceleration stage, bend electrode and/or energy filter.

54 Claims, 5 Drawing Sheets

(51) Int. Cl.

| | |
|---|---|
| *C23C 14/54* | (2006.01) |
| *H01J 37/08* | (2006.01) |
| *H01J 37/20* | (2006.01) |
| *H01J 37/304* | (2006.01) |
| *H01J 37/317* | (2006.01) |

(52) U.S. Cl.
CPC .............. *H01J 37/08* (2013.01); *H01J 37/20* (2013.01); *H01J 37/304* (2013.01); *H01J 37/3171* (2013.01); *H01J 2237/047* (2013.01); *H01J 2237/0473* (2013.01); *H01J 2237/0475* (2013.01); *H01J 2237/202* (2013.01); *H01J 2237/2065* (2013.01); *H01J 2237/2445* (2013.01); *H01J 2237/2482* (2013.01)

(58) Field of Classification Search
CPC ......... H01J 2237/047; H01J 2237/0473; H01J 2237/0475; H01J 2237/202; H01J 2237/2065; H01J 2237/2445; H01J 2237/2482; H01J 2237/30472; H01J 37/3023; H01J 2237/2001; H01J 37/04; C23C 14/48; C23C 14/54; C23C 14/541; C23C 14/56

USPC ............................................ 250/492.1–492.3
See application file for complete search history.

(56) References Cited

U.S. PATENT DOCUMENTS

| | | | |
|---|---|---|---|
| 5,177,366 | A | 1/1993 | King et al. |
| 5,393,984 | A | 2/1995 | Glavish |
| 6,055,460 | A | 4/2000 | Shopbell |
| 6,229,148 | B1 | 5/2001 | Prall et al. |
| 6,441,382 | B1 | 8/2002 | Huang |
| 6,744,377 | B1 | 6/2004 | Inoue |
| 6,777,696 | B1 | 8/2004 | Rathmell et al. |
| 7,112,809 | B2 | 9/2006 | Rathmell et al. |
| 7,507,978 | B2 | 3/2009 | Vanderberg et al. |
| 7,550,751 | B2 | 6/2009 | Benveniste et al. |
| 7,615,763 | B2 | 11/2009 | Vanderberg et al. |
| 8,124,946 | B2 | 2/2012 | Ryding et al. |
| 9,218,941 | B2 | 12/2015 | Jen et al. |
| 9,443,698 | B2 | 9/2016 | Vanderberg |
| 2015/0200073 | A1* | 7/2015 | Jen ..................... H01J 37/3171 250/281 |
| 2019/0066977 | A1 | 2/2019 | Jelinek et al. |

\* cited by examiner

145

150

160

BLENDED ENERGY IMPLANT

REFERENCE TO RELATED APPLICATIONS

This application claims the benefit of U.S. Provisional Application Ser. No. 63/229,751 filed Aug. 5, 2021, entitled, "BLENDED ENERGY ION IMPLANTATION" and U.S. Provisional Application Ser. No. 63/229,663 filed Aug. 5, 2021, entitled, "CHAINED MULTIPLE ENERGY IMPLANT PROCESS STEPS", the contents of all of which are herein incorporated by reference in their entirety.

FIELD

The present invention relates generally to ion implantation systems, and more specifically to a system and method for providing continuously controlled variable energy to an ion beam delivered to a workpiece during ion implantation thereof.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energizes and directs the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining or improving desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Present ion implantation technology establishes a recipe to implant ions under a specific condition into a workpiece, also called a substrate or wafer. Such a recipe results in a given concentration and depth profile of ions implanted within the substrate that is generally determined by a type or desired species of dopant being implanted, a density and composition of the workpiece, and implant conditions such as an energy of the implanted species (which determines a depth at which ions are implanted), the implant angle (e.g., tilt or twist) of a surface of the workpiece relative to the ion beam, and the total dose of implantation. Additionally, variables such as a temperature of the workpiece and/or charge states(s) of the ions being implanted can be controlled in an implant recipe to provide desired implant results.

In order to establish a desired dopant profile, it is typical to conduct multiple implants of the same species on the same substrate, generally using different combinations of energy, dose, tilt or twist. While dose, tilt and twist may be adjustable within a single implant by splitting the implant into multiple implant steps with each step having different input parameters, changing the energy of the implant to change the depth of implanted ions generally can necessitate significant adjustments and/or modifications to various settings, and/or electrical bias signals applied to power supplies and/or components of the ion implantation system for maintaining the integrity of desired characteristics of the ion beam (e.g., beam tuning). Such adjustments and/or modifications will typically add to time used to setup the ion implantation system (a so-called tune time), thus affecting productivity of the ion implantation system. Further, these beam tuning steps may require removing and repositioning a workpiece on a workpiece support such as a platen or clamp used to place the wafer in front of the ion beam, resulting in workpiece handling that can further affect system productivity as well as yield.

SUMMARY

The present disclosure provides a system and method to implant a distribution of energies (e.g., at equal or varying doses and/or angles) within a single, continuous implantation process. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with an example aspect of the present disclosure, an ion implantation system is provided, wherein an ion source is configured to ionize a dopant material and to generate an ion beam. A beamline assembly, for example, is positioned downstream of the ion source and configured to transport the ion beam toward a workpiece. A scanning apparatus, for example, is configured to scan one or more of the ion beam and the workpiece with respect to one another along a first scan axis, and an acceleration/deceleration stage is provided and configured to receive the ion beam during transport thereof. An end station is positioned downstream of the acceleration/deceleration stage, wherein the end station comprises a workpiece support configured to selectively position the workpiece in a path of the ion beam.

One or more power sources, for example, are operably coupled to the acceleration/deceleration stage, wherein the one or more power sources are configured to provide one or more electrical bias signals to the acceleration/deceleration stage. The acceleration/deceleration stage, for example, is configured to define a plurality of energies of the ion beam based on the one or more electrical bias signals.

A controller, for example, is configured to selectively modulate the one or more electrical bias signals provided to the acceleration/deceleration stage concurrent with the scanning of the one or more of the ion beam and workpiece along the first scan axis. The selective variation of the one or more electrical bias signals, in one example, is based, at least in part, on a position of the ion beam with respect to the workpiece and a predetermined implant profile across the workpiece.

In accordance with another example aspect, a method for ion implantation is provided, wherein an ion beam is directed toward a workpiece, and one or more of the ion beam and the workpiece are scanned with respect to one another, thereby implanting ions into the workpiece. Concurrent with the scanning of the one or more of the ion beam and the workpiece, an energy of the ion beam is selectively varied based, at least in part, on a position of the ion beam with respect to the workpiece and a predetermined implant profile across the workpiece. A resultant depth of implantation of ions into the workpiece is thereby varied concurrent with the scanning.

According to another example aspect, an ion implantation system having an ion source configured to generate an ion beam and an acceleration/deceleration stage is provided. The acceleration/deceleration stage, for example, is configured to receive the ion beam to produce a final ion beam having a final energy associated therewith. A workpiece support, for example, is configured to selectively position a workpiece along a path of the final ion beam, and a scanning apparatus is configured to scan one or more of the ion beam and workpiece support with respect to one another along a first scan axis and a second scan axis.

One or more power sources, for example, are operably coupled to the acceleration/deceleration stage and configured to provide one or more electrical bias signals thereto. The one or more electrical bias signals, for example, can comprise one or more of a voltage and a current. A waveform generator, for example, is further operably coupled to one or more of the one or more power sources, wherein the waveform generator is configured to controllably apply a waveform to the one or more electrical bias signals.

Further, a controller, for example, is operably coupled to the one or more power sources and the waveform generator, wherein the controller is configured to selectively vary the one or more electrical bias signals supplied to the acceleration/deceleration stage concurrent with the scanning of the one or more of the ion beam and the workpiece support. As such, a plurality of energies of the ion beam are implanted to the workpiece in a predetermined manner. The selective variation of the one or more electrical bias signals supplied to the acceleration/deceleration stage, for example, is based, at least in part, on the waveform, a position of the ion beam with respect to the workpiece, and a predetermined energy of ions implanted into the workpiece.

In accordance with yet another example aspect, an ion implantation system is provided having an ion source configured to form an ion beam and to direct the ion beam toward a workpiece. One or more beamline components, for example, are configured to transport the ion beam along a beam path, and a scanner apparatus is configured to selectively iteratively scan one or more of the ion beam and the workpiece along a first scan axis. An acceleration/deceleration stage is positioned downstream of the scanner apparatus, and a power source is configured to provide an electrical bias signal to the acceleration/deceleration stage. A controller, for example, is configured to vary or modulate the electrical bias signal provided to the acceleration/deceleration stage from the power source as one or more of the ion beam and the workpiece is iteratively scanned along the first scan axis, thereby selectively varying a final energy of ions implanted into the workpiece along the first scan axis.

In another example, an ion implantation system is provided, comprising a power supply configured to provide an electrical bias signal corresponding to a predetermined waveform. An energy varying component, for example, is configured to receive the electrical bias signal to selectively vary an ion beam to a final energy based on the predetermined waveform, wherein the final energy is selectively variable.

In accordance with still another example aspect, a process is provided for ion implantation of a single workpiece with a plurality of sequential implant steps at different predetermined energies using a single tuning recipe. The process comprises configuring ion implantation parameters to implant an ion beam at a first predetermined energy, and establishing a first minimum ion beam angle associated with the first predetermined energy. An ion beam orientation angle is defined relative to the single workpiece based on the establishing of the first minimum ion beam angle associated with the first predetermined energy. The ion implantation parameters, for example, are adjusted to implant an ion beam at a second predetermined energy, and a minimum ion beam angle associated with the second predetermined energy is established. The ion beam orientation angle, for example, is further controlled relative the workpiece based on the establishing of a minimum ion beam angle associated with the second predetermined energy. Further, the workpiece is processed to implant ions therein at the first and second predetermined energies in sequential implant steps while adjusting the ion beam orientation with respect to the workpiece with each sequential implant step.

In another example aspect. a method is provided for implanting ions into a single workpiece with a plurality of sequential implant steps at different predetermined energies using a single tuning recipe, wherein one or more ion implantation parameters are configured to implant an ion beam at a first predetermined energy. One or more ion implantation parameters are further configured to implant an ion beam at a second predetermined energy, and ions are sequentially implanted into the workpiece at the first predetermined energy and the second predetermined energy.

In yet another example aspect, a method is provided for implanting ions into a single workpiece with a plurality of sequential implant steps at different predetermined energies using a single tuning recipe. One or more ion implantation parameters, for example, are configured to implant an ion beam at a first predetermined energy, and a minimum ion beam angle is established that is associated with the first predetermined energy A first ion beam orientation angle is defined relative the workpiece based on the establishing of the minimum ion beam angle associated with the first predetermined energy, and the one or more ion implantation parameters are controlled to implant an ion beam at a second predetermined energy. A minimum ion beam angle associated with the second predetermined energy, for example, is further established, and a second ion beam orientation angle is defined relative the workpiece based on the establishing of the minimum ion beam angle associated with the second predetermined energy. Ions are further sequentially implanted into the workpiece at the first predetermined energy and the second predetermined energy while concurrently controlling the respective first ion beam orientation and second ion beam orientation relative the ion beam.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
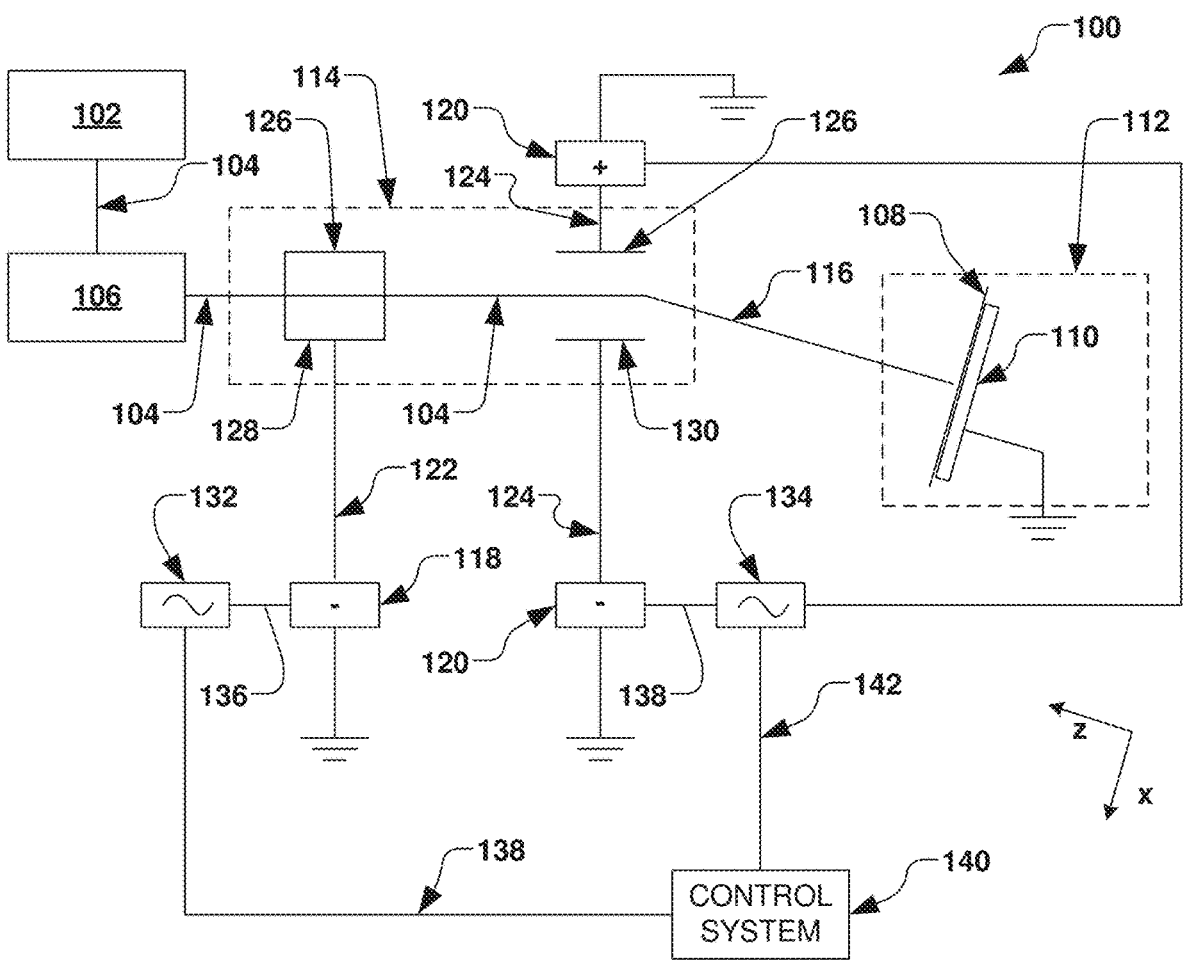
FIG. 1 is a block diagram of a portion of an ion implantation in accordance with several aspects of the present disclosure.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without each and every one of these specific details.

The present disclosure provides a system and method to implant a distribution of energies (e.g., at equal or varying doses and/or angles) within a single, continuous implantation process, without the significant adjustments and/or workpiece handling previously seen. For example, the present disclosure provides various processes ranging from as simple as implanting two independent implant energies in a single implant, to more complex processes having a continuous distribution or range of energies in a predetermined range with a fixed or controlled gradient of dose and/or beam angle across the distribution or range of energies. For example, the present disclosure can be utilized when a need exists for generating a so-called box-shaped profile of dopant concentration vs. depth which may be advantageous in semiconductor device manufacturing.

Further, the present disclosure provides for pre-tuning of the ion implantation system for a plurality of recipes prior to implant. For example, various components of the ion implantation system can be advantageously pre-tuned for all of the plurality of recipes for a given workpiece prior to commencement of the implant, whereby each of the plurality of recipes can be selectively implemented for implantation into each workpiece in the single implant, or in a sequence of implant steps that can be processed or carried out without removing the workpiece from a workpiece support.

The present disclosure provides a continuous energy distribution or so-called "blended energy" implant, whereby the energy of ions implanted into the workpiece is dynamically varied and controlled within each pass of the ion beam across a surface of the workpiece. The control implements a time-varying electrical bias signal (e.g., voltage and/or current) applied or otherwise provided to one or more power supplies associated with an acceleration/deceleration stage (also called an accel/decel electrodes). In addition, scanner waveforms utilized for scanning the ion beam and/or control of one or more post-final energy elements, which may comprise an angular energy filter or "AEF", typically including bending elements, etc., for example, can be further based, at least in part, on the time-varying electrical bias signal applied to the one or more power supplies associated with the acceleration/deceleration stage.

For example, a time-varying voltage can be applied to one or more power supplies associated with the accelerating or decelerating stage to provide a continuously controlled variable energy ion beam to a workpiece for ion implantation thereof. In addition, one or more beam bending elements configured to bend the ion beam once it attains its final energy can be "servo'd off" of the time-varying voltage applied to the one or more power supplies associated with an acceleration/deceleration stage, thereby either maintaining a fixed angle or continuously varying an angle at which the ion beam of variable energy strikes the workpiece.

The time-varying voltage, in one example, can be achieved by incorporating a waveform generator that is operably coupled to the one or more power supplies and configured to apply one or more waveforms thereto. A controller, for example, is configured to alter, vary, maintain, or otherwise provide the time-varying voltage to the respective accel/decel stage and/or post-final energy elements.

In one example, the present disclosure provides for rapidly switching waveforms, energies and calibration factors as a function of workpiece position (e.g., slow scan or vertical position of the workpiece with respect to the ion beam) for various hardware designs. Thus, the present disclosure provides sufficiently fast response times to be compatible with various other dose and energy patterning functions as may be implemented during an ion implant cycle.

As previously noted, the energy control and adjustment capabilities provided by the present disclosure advantageously minimize handling of workpieces being processed. For example, in contrast with conventional systems where workpieces are transferred multiple times between load lock chambers and a process chamber to achieve multiple-energy implants, the present disclosure can implant all desired energies into the workpiece while maintaining the workpiece in the process chamber and on the workpiece support, without removal therefrom, thus resulting in lower yield losses due to handling errors or queue time effects, and significantly increasing workpiece throughput in the ion implant process.

The present disclosure is ideally suited for beamline implanters with downstream accel/decel capability (e.g., hybrid scan implanters with spot beams, and single wafer implanters with scanned spot or ribbon-shaped beams). To maintain energy purity, such implanters may also have an optional angular energy filter to selectively implant the substrate with the beam at a specified desired final energy (e.g., filtering out off-energy particles). While implantation systems incorporating upstream acceleration components or with post-accel magnets used for beam parallelism, for example, are not excluded by the present disclosure, such ion implantation systems can suffer from limitations due to effects on downstream components or in speed of adjustments needed in magnet currents to be able to match the performance of voltage-based post-accel, downstream acceleration, and AEF-based tools. As such, the present disclosure does not exclude alternate beamlines that may use magnetic or electrostatic beamline elements post-accel to accomplish similar capabilities as other embodiments listed herein. However, it will be understood that the present invention provides its greatest advantage in systems having downstream acceleration or deceleration components and/or in combination with downstream angular bend components, wherein fast energy variation can be implemented without varying or modifying electrical biasing of upstream components such as an ion source, extraction electrodes, a mass analyzer, a scanner corrector or a parallelizer and the like.

It should also be noted that while Plasma Immersion Ion Implantation (PIII) or plasma doping tools may also be used to produce voltage ramps to create similar doping profiles as provided by the present invention, the invention described herein provides a path for dynamically tunable implant energy for mass selected species over a much broader energy range than practically possible with plasma doping.

The present disclosure can provide a predetermined number of energies (e.g., an arbitrarily large number of energies) to produce a generally blended box-like dopant energy distribution that cannot be achieved with just a few ion implant passes at different energies. To accomplish this, deceleration, acceleration, and any angular deflection, for example, are controlled by synchronized, time-varying voltages or currents at a higher frequency (e.g., an order of magnitude or higher) than any fast or slow scanning of the workpiece or ion beam.

Tuning the shape of the electrical bias signal or waveform applied to the acceleration/deceleration electrodes, for example, can also be used to adjust dose weighting of an energy distribution for dopant and/or energy profile tuning. The energy can be blended at much higher frequency than the horizontal scanning of the ion beam, thereby enabling singular horizontal angle tuning, a single uniformity correction waveform, a single vertical angle offset value and a single set of dose references to be used for the blend of energies (e.g., each horizontal and vertical beam angle or flux measurement can include an entire distribution of energies). Eliminating the need to tune each energy in a discrete manner reduces total setup time for the ion implantation system while producing a unique blended dopant profile.

One advantageous aspect of the present disclosure enables the production of smoother dopant distribution profiles (e.g., where a "box-like" profile is desired) than can be reasonably produced by a series of discrete ion implant process steps at some subset of energies.

Accordingly, in accordance with the present invention, a wave generator is configured to perform a high frequency variation of voltage biases applied to an accel/decel column, thereby providing an ion beam that is continuously varying in energy. The present disclosure can be advantageously implemented using a scanned-pencil beam or so-called scanned-spot beam architecture, as the energy can be advantageously varied downstream of a scanner via a single component that defines the final energy of the ion beam, thus providing numerous advantages with respect to tuning and other variability that can be undesirably introduced when varying energy using upstream components.

The present disclosure provides productivity advantages over conventional systems by removing workpiece exchange or swap time and setup time by implanting multiple energies without having to retune the beam or move the workpiece to and from the workpiece holder and/or the end station. In one specific embodiment, the present disclosure contemplates providing a high frequency variable power supply to the accel/decel voltage and optional bend voltage, whereby controls can be provided to synchronize the accel/decel voltage and bend voltage to maintain a constant angle of the ion beam at the workpiece. As such, a continuously controlled variable distribution of energies is provided at the workpiece, thus implanting all energies in a single operation on the workpiece, as opposed to implanting the workpiece with a first dose and/or angle at a first energy, modifying the system to implant at a second energy, and then implanting the workpiece with the second dose and/or angle at the second energy.

The present disclosure provides a system and method for continuously varying, modulating, oscillating, or slewing between a predetermined range of energies for a desired implant when one or more of the ion beam and the workpiece are being scanned. For example, a waveform is applied to produce a predetermined energy profile, whereby custom dopant distributions are defined inside the workpiece that are not otherwise obtainable with conventional ion implants. In one example, while a very large number (e.g., hundreds) of ion implant energies might be desirable, for reasons of productivity, such a very large number of energies would be broken down to a smaller number of discrete energies (e.g., 20-30 energies) that would attempt to approximate a desired resultant implant profile over a predetermined energy range.

In a conventional implant, however, even with a beamline adjusted for each of the smaller number of discrete energies, the setup and retuning typically required (e.g., 20-30 times) amounts to an unacceptably significant time for setup or tuning for the multi-energy implant. In addition, conventionally, the workpiece may be required to be removed from its position on a workpiece support (e.g., platen, chuck or electrostatic clamp (ESC)) and/or the processing chamber during each beam tuning step, thereby further prolonging processing setup time and possibly creating particle contamination and/or workpiece handling issues.

By contrast, in accordance with the present disclosure, merely one setup of the beamline is performed, as the energy is continuously slewing or dynamically altered. For example, if implant energies of 5 KeV to 25 KeV are desired, the conventional implant process may be divided into nine discrete passes of the workpiece through the ion beam, changing the energy in discrete steps between each pass (e.g., 5 KeV; 7.5 KeV; 10 KeV; 12.5 KeV; 15 KeV; 17.5 KeV; 20 KeV; 22.5 KeV; 25 KeV). More typically, however, given the significant setup time required between each pass, the desired 5 KeV to 25 KeV implant might be broken down to only three implant steps at say 5 KeV, 15 KeV, and to 25 KeV, resulting in a relatively non-uniform aggregate dopant profile, which is likely to be unacceptable.

The present disclosure, however, provides an implant energy profile that is significantly more uniform over a predetermined energy range than conventionally seen by constantly varying the energy in a single pass of the ion beam over the workpiece in a predetermined manner. It should be noted that the terms "constantly" and "continuously" are intended to connote a change or variation in energy along the single pass of the ion beam with respect to the workpiece, and can include various continuous and/or step-wise waveforms or increments. As such, the energy is varied at a high rate as the ion beam is swept with respect to the workpiece. The variation, for example, can be a constant oscillation or variation at a high enough frequency such that all locations on the workpiece are exposed to all of the varied energies. The resultant aggregate or total energy profile is much more uniform or "box-like."

In one example, the beam may be moving (e.g., electro-statically scanned) along a first axis in a so-called fast-scan direction (e.g., the horizontal direction) across the workpiece, such as at a horizontal scan rate of approx. 41 Hz. As such, the horizontal motion of the beam, for example, can be quantized as roughly 1000 steps across the workpiece. In the a slow-scan scan direction (e.g., the vertical direction), the workpiece may be translated (e.g., mechanically scanned) along a second axis, whereby the vertical scan speed is significantly slower than the horizontal scan speed. In this example, the desired variable energy frequency is significantly higher than the fast-scan frequency and might be on the order of KHz or MHz (e.g., based on the selection of a power supply). The present disclosure appreciates that it is generally desirable to have a complete sweep of the energy range take place before the ion beam goes to its next traversal across the workpiece, so that all of the desired energies are implanted at each x and y location of the workpiece. For example, each location across the workpiece can be considered as a pixel if the continuous motion of the workpiece with respect to the ion beam is considered to be broken down into individual quantized bits.

The present disclosure thus provides all of the energies of a desired range to be implanted across the entirety of the workpiece that is scanned, thus uniformly doping the entire workpiece with any number of different energies. For example, a respective electrical bias signal controls the acceleration/deceleration apparatus (e.g., also referred to as an accel/decel apparatus) and may also control a bending apparatus (e.g., also referred to as a bend apparatus) of the beam. If the respective voltage is considered to be a pure triangle waveform, for example, then a uniform dose can be provided at each of the energy steps along the waveform. The waveform can be further tuned to change the relative dose at different energy intervals along such a continuum. Thus, the waveform induced on the energy, for example, can change the relative concentration of the energies within that spread or given scan.

In order to provide a general overview of various concepts of the present disclosure, FIG. 1 illustrates an example of a system 100 for implanting ions having a continuously controlled variable energy. In accordance with one example, the system 100 comprises an ion source 102 configured to ionize a dopant material for generating an ion beam 104. A beamline assembly 106 is positioned downstream of the ion source 102, wherein the beamline assembly is configured to transport the ion beam 104 toward a workpiece 108 positioned on a workpiece support 110 (e.g., a chuck) in an end station 112.

An acceleration/deceleration stage 114, for example, is further provided and configured to receive the ion beam 104 during transport thereof, and to produce a continuously controlled variable energy ion beam 116 for implantation into the workpiece 108 that is selectively positioned within the end station 112. In one example, one or more variable power sources 118, 120 (e.g., one or more power supplies) are operably coupled to the acceleration/deceleration stage 114 and respectively provide one or more electrical bias signals 122, 124 (e.g., a voltage or a current) thereto.

The one or more electrical bias signals 122, 124, for example, are applied to one or more electrodes 128 positioned above and below the ion beam 104 as it passes through the acceleration/deceleration stage 114. The acceleration/deceleration stage 114 can include one or more acceleration/deceleration electrodes 128 for example, and one or more bend electrodes 126, 130, whereby the electrical bias signals 122 applied to the acceleration/deceleration electrodes yield the continuously controlled variable energy ion beam 116, and the electrical bias signals 124 applied to the bend electrodes yield the continuously angular control of the ion beam 104. The one or more electrical bias signals 122, 124, for example, are further selectively varied via one or more waveform generators 132, 134 that are operably coupled to the one or more power sources 118, 120 to provide one or more waveforms 136, 138 (e.g., one or more time-varying signals) thereto. A controller 140 (e.g., a control system comprising one or more control apparatuses) is further provided for selective control of the one or more electrical bias signals 122, 124 via a control of the one or more power sources 118, 120 and one or more waveform generators 132, 134. The controller 140 is further operable to control other aspects of the system 100, such as the workpiece support 110, and other components of the beamline assembly 106, such as a beam scanning mechanism, focusing and steering elements or other beam control components, as will be discussed further infra.

In one example, control and feedback signals 142 between the controller 140 and the one or more power sources 118, 120 and one or more waveform generators 132, 134 selectively control and vary an energy of the ion beam 104 to define the continuously controlled variable energy ion beam 116. For example, control of the electrical bias signal 122 (e.g., a deceleration voltage) supplied to the acceleration/deceleration electrodes 128 can selectively vary (increase and decrease) the energy of the ion beam 104 based on the waveform 136 provided to the power source 118 from the waveform generator 132, thus defining a voltage differential associated with the acceleration/deceleration electrodes. Similarly, control of the electrical bias signal 124 supplied to the bend electrode 130 can selectively bend the ion beam 104 upward or downward based on the waveform 138 provided to the power source 120 from the waveform generator 134.

Polarity of the one or more electrical bias signals 122, 124, for example, can be switched when controlling the acceleration/deceleration and bending of the ion beam 104. For example, when stepping through various different voltages supplied to the bend electrode 130 and the acceleration/deceleration electrodes 128, different energies can be attained in the continuously controlled variable energy ion beam 116. Each of the waveforms 136, 138, for example, can be synchronized to a step size of a mechanical scan of the workpiece 108 (e.g., along a so-called slow-scan direction or the x-axis), as will be discussed in greater detail infra. Similarly, the electrical bias signal 124 (e.g., a bend voltage) applied to the bend electrode 130 can be varied to either maintain an angular relationship as constant between the continuously controlled variable energy ion beam 116 and the workpiece 108 as the energy of the continuously controlled variable energy ion beam is varied. Further, the angular relationship between the continuously controlled variable energy ion beam 116 and the workpiece 108 can be varied as the energy of the continuously controlled variable energy ion beam is varied via the control of the electrical bias signal 124.

In another example, when the ion beam 104 is electrostatically or magnetically reciprocally scanned (e.g., along a so-called fast-scan direction or the y-axis), one or more periods of variation of the electrical bias signals 122, 124 on the acceleration/deceleration electrode 128 and/or the bend electrode 130 (e.g., one or more periods of voltage variation based on the one or more waveforms 136, 138) can be completed prior to or upon reversal of direction of the scanning of the ion beam. For example, continuously controlled variable energy ion beam 116 can define an "energy scan" that is varied, cycled, or modulated via a synchronization of the electrical bias signals 122, 124 on the acceleration/deceleration electrode 128 and/or the bend electrode 130. The energy scan, for example, is varied at a substantially higher frequency than the scanning of the ion beam 104 in the fast-scan direction.

Accordingly, the electrical bias signals 122, 124 supplied or provided to the acceleration/deceleration electrodes 126 and the bend electrode 130 can be synchronized or otherwise controlled to provide a uniform distribution of the energy achieved during implantation into the workpiece 108. For example, a triangular waveform 145 shown in FIG. 2A can be viewed as a single period of substantially small "steps" in energy variation or modulation, and as the same amount of time is provided at each step, a uniform energy profile can be achieved that substantially resembles the triangular waveform. In the example shown in FIG. 2A, approximately 100 scans of a predetermined range of energies can be completed within each scan of the ion beam in the "fast-scan" "step" of the ion beam across the surface of the workpiece or wafer.

If the amount of time spent at each voltage is added together, each voltage is present in the waveform for the respective amount of time. Therefore, when a plurality of energies (e.g., 5 KeV, 5.1 KeV, 5.2 KeV . . . 24.9 KeV, 25 KeV) are implanted in accordance with the present disclosure, each of the plurality of energies is implanted for the same amount of time from the lowest energy (e.g., 5 KeV) to the highest energy (e.g., 25 KeV). If a pure triangle waveform is not utilized, the derivative of the waveform, for example, can be considered equal to the dwell time at the given voltage. A waveform 150 shown in FIG. 2B, for example, illustrates longer times are spent at higher energies, and that as the maximum decel voltage is reached (e.g., the lowest energy), less time is spent at that lower energy before transitioning to the next energy. The implant profile in the workpiece, for example, can be thus designed to have a greater dosage at higher energies of the range than at lower energies.

The present disclosure, for example, provides the capability to implant an arbitrarily large number of different process steps of different energies at different doses, all nearly simultaneously or concurrent with a single pass of the ion beam across the workpiece. In a production environment, for example, the number of implants in a conventional process can be limited (e.g., for production reasons such as time or cost constraints) to implanting three energies at three different doses into the same mask, and then relying on a subsequent anneal step to attain a particular dopant profile on a workpiece. However, the present disclosure appreciates that for the benefit of the devices formed on the workpiece, a smoother profile of the dopant concentration in the workpiece can be desirable. However, each time an energy is added to the conventional process flow, a cost, such as productivity loss, is added. The present disclosure avoids this additional cost, as the present disclosure can provide any number of combinations of energy and dose with virtually no added cost per process step.

The present disclosure, for example, can advantageously control the dopant concentration, angular distribution, and/or ion implantation depth (e.g., corresponding to energy of the implant) in the workpiece to correspond with desired device characteristics provided by the implanted ions. For example, research and design (R&D) may formulate specifications using various models to yield a desired R&D implant profile that require a particular dopant concentration at a given implant depth, whereby the specifications require a large number of implants (e.g., nine or ten implants) into the workpiece. However, in a production environment, only a limited number of implants (e.g., only two or three implants) may be permitted to be performed on the workpiece due to various production concerns (e.g., time and, wafer handling, and costs associated with each implant). Thus, instead of performing the large number of implants to achieve the desired R&D implant profile on the workpiece, various compromises are typically made to achieve an implant profile that attempts to approximate the desired R&D implant profile within the limited number of implants that are permitted. The present disclosure, however, advantageously provides the desired R&D implant profile and dopant concentration without having to make such approximations and compromises.

Figure 2A:
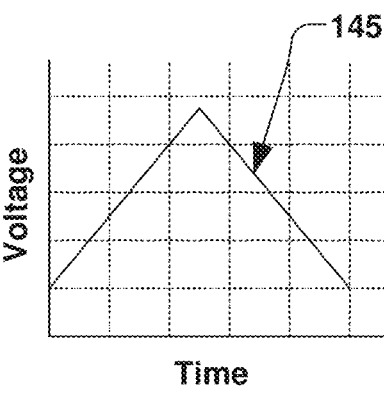
FIG. 2A is a graph illustrating a uniform distribution of ion dose by energy in accordance with an example aspect of the disclosure.
Figure 2B:
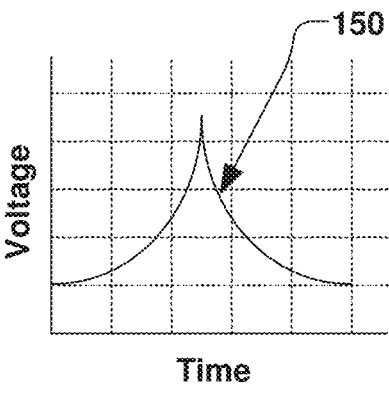
FIG. 2B is a graph illustrating a derivative of voltage adjustment in accordance with an example aspect of the disclosure.
Figure 2C:
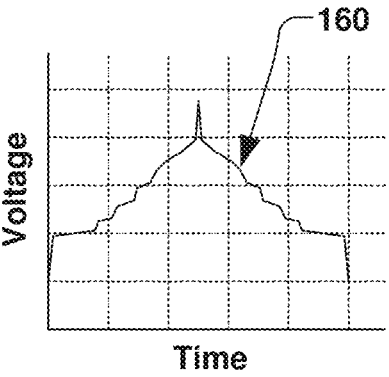
FIG. 2C is a graph illustrating another voltage adjustment in accordance with an example aspect of the disclosure.

Another exemplary waveform 160 according to the present disclosure is illustrated in FIG. 2C whereby the waveform comprises a plurality of steps of varying durations, whereby a plurality of energies are implanted in a single cycle. The plurality of energies can be limited (e.g., three energies), such that the waveform can be described as having a number of generally flat sections interrupted by a number of steps in voltage. In a simple example, three discrete energies can be achieved by a first long flat section, a short step, followed by another long flat section, a short step, then followed again by further long flat section. In this example, all three energies can be implanted in a single implant cycle. For example, a total dose can be set to 1.5e14, since all of the doses that are implanted at the three energies are added together. As such, all three energies can be implanted into the workpiece without removing the workpiece from the workpiece support and process chamber or end station. As such, the workpiece is not exposed to atmospheric exposure between steps, and the workpiece is not subjected to workpiece handling hardware or processing steps that can induce misalignments and/or potentially catastrophic dropping of the workpiece.

Further, since the implant energy levels in accordance with the present disclosure are being swept continuously, a profiler (e.g., a Faraday cup) can move substantially slower than the change in energy described herein, and the average flux of the ion beam can be measured at each position, inclusive of all the energies. As such, the present disclosure can be practiced with just one initial setup time to tune the ion implantation system for uniformity and angles, etc. In addition, the present disclosure can be implemented in systems incorporating either acceleration or deceleration to achieve the final energy of the ion beam. For example, the polarity of the power supply that sets the final energy can be switched to provide acceleration or deceleration, as desired.

The present disclosure thus provides a high-frequency real time control of the energy of ions implanted into the workpiece 108 of FIG. 1 by providing a time-varying signal on the voltage applied to the acceleration/deceleration stage 114 (e.g., the last acceleration or deceleration of the ion beam 104 prior to being implanted) in order to produce a predetermined energy distribution across the workpiece 108. It should be noted that the time-varying signal associated with the one or more waveforms 136, 138, can comprise any desired waveform that can be advantageously controlled to provide any desired energy profile across the workpiece 108.

The one or more waveform generators 132, 134, for example, can be programmed to provide any desired waveform, such as a step, a series of step functions, a curve, or any desired form, even including a randomized form, whereby the waveform is controlled by a controller. Accordingly, a desired dopant concentration and/or energy profile can be provided, whereby the waveform can be designed to deliver the desired dopant concentration and/or energy profile at the workpiece 108. In general, in a waveform viewed on an x-y axis, where x is time and y is voltage applied to the acceleration/deceleration stage 114, at any given time, the voltage will yield an energy, such that the voltage waveform defines a distribution of energies. The derivative of the distribution of energies, for example, yields the relative dose per energy level. The percentage of time at a given voltage needed to ascertain a given energy is the proportion of the total implanted dose that will be achieved at that energy.

FIGS. 2A and 2B illustrate the two waveforms 145, 150 that are synchronized in order to control both the acceleration or deceleration of the ion beam 104 by the acceleration/deceleration electrodes 128 as well as the bend electrodes 130. Bending of the ion beam 104, for example, is synchronized via the electrical bias signals 124 applied to the bend electrodes 130 in order to maintain a constant angle of the ion beam 104 relative to the workpiece 108. The electrical bias signals 122, 124 to the acceleration/deceleration electrodes 128 and bend electrodes 130, for example, can thus be synchronized by providing a synchronized signal between the respective waveform generators 132, 134 or by a single waveform generator. While not shown, the present disclosure, for example, further contemplates one waveform generator being implemented, whereby the polarity of a single waveform generator can be split to provide separate desired electrical biasing to the acceleration/deceleration electrodes 128 and to the bend electrodes 126, 130.

Accordingly, the controller 140 can control the electrical bias signals 122, 124 to the acceleration/deceleration electrodes 128 and bend electrodes 126, 130 in a predetermined manner in order to achieve a predetermined energy distribution at any given point on the workpiece 108. Alternatively, it is to be appreciated that the present invention can be implemented without a bend in the ion beam 104, such that the controller 140 can control the electrical bias signals 122 to the acceleration/deceleration electrodes 128 in a predetermined manner in order to achieve the predetermined energy distribution at any given point on the workpiece 108. In accordance with one further example, the energy distribution does not change based on the location on the workpiece 108.

Thus, the present disclosure is directed generally toward a system, apparatus, and method for varying an energy of an ion beam in an ion implantation system. More specifically, the present disclosure is directed to systems, apparatuses, and methods for varying energy of an ion beam as the ion beam is scanned across a workpiece.

The present disclosure is applicable to, and is contemplated for implementation in various ion implanter architectures. For example, the present disclosure is applicable to at least three types of ion implanters: those wherein a ribbon ion beam is defined and transported along a beamline, the ribbon beam having a lengthwise dimension greater than a width of the workpiece being irradiated with the ion beam and the workpiece is scanned in front of the ribbon beam substantially transverse to the lengthwise dimension thereof; those that employ an ion beam that has a relatively static cross-sectional dimension (e.g., a pencil or spot beam) and in which the workpiece is moved relative to the ion beam in two dimensions; and those that employ a hybrid system in which a pencil or spot ion beam is oscillated or scanned along a first direction relative to the workpiece to form a ribbon-shaped scanned beam and the workpiece is moved along a second direction that is transverse to the first direction for implantation of the entire workpiece.

The disclosed variable control of energy distribution in the ion implantation process has not been heretofore disclosed or contemplated, particularly a variable control of the implantation energy in a continuous manner across the surface of a target workpiece. Thus, the present disclosure provides a system, apparatus, and method for varying an energy distribution of ions implanted by an ion beam across the workpiece in a continuous manner.

It will be understood that the foregoing application is but one of various processes and applications that are enabled by the continuous and variable energy ion implantation system and method of the present disclosure. The disclosure and claim scope are not limited to the solution for this problem, nor is it limited to a process for providing variable energy implants in any shape or specific predetermined contour on the workpiece. The variable, continuous, non-uniform ion energy implantation process of the present disclosure can be implemented in any manner as desired to provide a continuously variable implant depth profile, in addition to a non-continuous variable implant depth profile. For example, it is contemplated that the present disclosure can be utilized in any desired application wherein variable ion implantation depths are desired via selective variation of ion implant energy. There can be a number of reasons to implant at different energies, which translates to different ion implant depths across the surface of a workpiece, including but not limited to: variation of threshold voltages across the workpiece; systematic profile changes in energy profile of the implant across the scan width of the workpiece; and the ability to implant multiple dies of different electrical characteristics on a single wafer.

Figure 3:
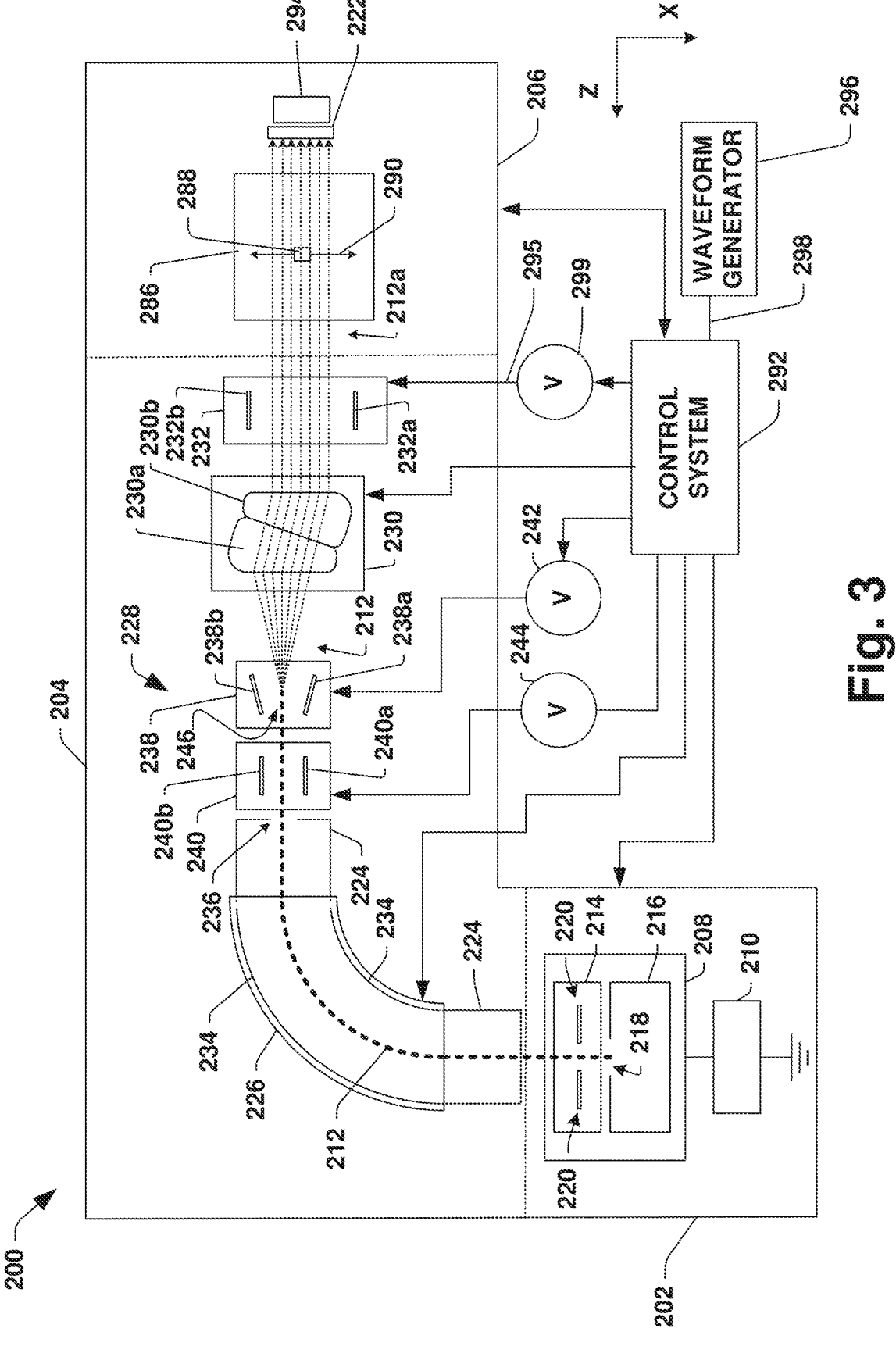
FIG. 3 is a schematic block diagram of an example ion implantation system in accordance with several aspects of the present disclosure.

FIG. 3 illustrates an exemplary ion implantation system 200 wherein ion beam energy can be selectively varied and/or controlled as described herein. The system 200 has a terminal 202, a beamline assembly 204, and an end station 206. The terminal 202 includes an ion source 208 powered by a high voltage power supply 210 that produces and directs an ion beam 212 to the beamline assembly 204. In this regard, the ion source 208 generates charged ions that are extracted from the source via an extraction assembly 214 and formed into the ion beam 212 that is subsequently directed along a beam path in the beamline assembly 204 to the end station 206.

To generate the ions, a dopant material (not shown) to be ionized is provided within a generation chamber 216 of the ion source 208. The dopant material, for example, can be fed into the chamber 216 from a gas source (not shown). In one example, in addition to power supply 210, it will be appreciated that any number of suitable mechanisms (not shown) can be used to excite free electrons within the ion generation chamber 216, such as RF or microwave excitation sources, electron beam injection sources, electromagnetic sources and/or a cathode which creates an arc discharge within the chamber. The excited electrons collide with the dopant gas molecules, thereby generating ions. Generally, positive ions are generated, although the disclosure herein is also applicable to systems wherein negative ions are generated.

The ions are controllably extracted through a slit 218 in the chamber 216 by an ion extraction assembly 214, wherein the ion extraction assembly comprises a plurality of extraction and/or suppression electrodes 220. The ion extraction assembly 214, for example, can include a separate extraction power supply (not shown) to bias the extraction and/or suppression electrodes 220 for accelerating the ions extracted from the generation chamber 216. It can be appreciated that since the ion beam 212 comprises like-charged particles, the ion beam may have a tendency to expand radially outwardly, or beam "blow up", as the like-charged particles repel one another within the ion beam. It can also be appreciated that this phenomenon of beam blow-up can be exacerbated in low energy, high current (e.g., high perveance) beams, where many like-charged particles are moving in the same direction relatively slowly, and wherein there is an abundance of repulsive forces among the particles, but little particle momentum to keep the particles moving in the direction of the beam path.

Accordingly, the extraction assembly 214 is generally configured such that the ion beam 212 is extracted at a high energy so that the ion beam does not blow up (e.g., so that the particles have sufficient momentum to overcome repulsive forces that can lead to beam blow up). Moreover, it is generally advantageous to transfer the beam 212 at a relatively high energy throughout the system, wherein this energy can be reduced as desired just prior to implantation of the ions into the workpiece 222 to promote beam containment. It can also be advantageous to generate and transport molecular or cluster ions, which can be transported at a relatively high energy but are implanted with a lower equivalent energy, since the energy of the molecule or cluster is divided amongst the dopant atoms of the molecule.

In the exemplary ion implantation system depicted in FIG. 3, the beamline assembly 204 includes a beamguide 224, a mass analyzer 226, a scanning system 228, a parallelizer 230, and one or more acceleration or deceleration and/or filtering subsystems 232. The mass analyzer 226 is configured to have approximately a ninety-degree angle and comprises one or more magnets (not shown) that serve to establish a (dipole) magnetic field therein. As the ion beam 212 enters the mass analyzer 226, it is correspondingly bent by the magnetic field such that desired ions are transported down the beam path, while ions of an inappropriate charge-to-mass ratio are rejected. More particularly, ions having too great or too small a charge-to-mass ratio are deflected either insufficiently or exceedingly so as to be steered into side walls 234 of the mass analyzer 226 so that the mass analyzer allows those ions in the beam 212 that have the desired charge-to-mass ratio to pass there-through and exit through a resolving aperture 236.

A scanning system 228 is further illustrated, wherein the scanning system, for example, comprises a scanning element 238 and a focusing and/or steering element 240. The scanning system 228 can comprise various known scanning mechanisms, such as demonstrated in U.S. Pat. No. 4,980,562 to Berrian et al.; U.S. Pat. No. 5,091,655 to Dykstra et al.; U.S. Pat. No. 5,393,984 to Glavish; U.S. Pat. No. 7,550,751 to Benveniste et al.; and U.S. Pat. No. 7,615,763 to Vanderberg et al., the entirety of which are hereby incorporated herein by reference.

In the exemplary scanning system 228, respective power supplies 242, 244 are operatively coupled to a scanning element 238 and a focusing and steering element 240, and more particularly to respective electrodes 238a, 238b and 240a, 240b located therein. The focusing and steering element 240 receives the mass analyzed ion beam 212 having a relatively narrow profile (e.g., a "pencil" or "spot" beam in the illustrated system 200), wherein a voltage applied by the power supply 244 to the plates 240a and 240b operates to focus and steer the ion beam to an optimal point, preferably a scan vertex 246, of the scanning element 238. A voltage waveform applied by the power supply 242 (e.g., the power supply 244 can also serve as the power supply 242) to the scanner plates 238a and 238b then scans the beam 212 back and forth to spread the beam 212 out into an elongated scanned or ribbon-shaped beam (e.g., a scanned beam 212), having a width or lengthwise dimension in the x-axis that may be at least as wide as or wider than the workpieces of interest. It will be appreciated that the scan vertex 246 can be defined as the point in the optical path from which each beamlet or scanned part of the ribbon beam appears to originate after having been scanned by the scanning element 238.

It will be understood that an ion implantation system of the type described herein may employ different types of scanning systems. For example, electrostatic systems or magnetic systems could be employed in the present invention. A typical embodiment of an electrostatic scanning system includes a power supply coupled to scanner plates or electrodes 238a and 238b, where the scanner 238 provides a scanned beam. The scanner 238 receives the mass analyzed ion beam having a relatively narrow profile (e.g., a "pencil" beam in the illustrated system), and a voltage waveform applied by the power supply 242 to the scanner plates 238a and 238b operates to scan the beam back and forth in the X direction (the scan direction) to spread the beam out into an elongated ribbon-shaped beam (e.g., a scanned beam), having an effective X-direction width that may be at least as wide as or wider than the workpieces of interest. Similarly, in a magnetic scanning system, a high current supply is connected to the coils of an electromagnet. The magnetic field is adjusted to scan the beam. For purposes of this disclosure, all different types of scanning systems are contemplated, and the electrostatic system described herein is used for illustration purposes only.

The scanned beam 212 is subsequently passed through the parallelizer 230. Various parallelizer systems 230 are demonstrated by U.S. Pat. No. 5,091,655 to Dykstra et al.; U.S. Pat. No. 5,177,366 to Dykstra et al.; U.S. Pat. No. 6,744,377 to Inoue; U.S. Pat. No. 7,112,809 to Rathmell et al.; and U.S. Pat. No. 7,507,978 to Vanderberg et al., the entirety of which are hereby incorporated herein by reference. As the name implies, the parallelizer 230 causes the incoming scanned pencil beam having divergent rays or beamlets to be deflected into parallel rays or beamlets 212a so that implantation parameters (e.g., implant angles) are uniform across the workpiece 222. In the presently illustrated embodiment, the parallelizer 230 comprises two dipole magnets 230a, 230b, wherein the dipoles are substantially trapezoidal and are oriented to mirror one another to cause the beam 212 to bend into a substantially "s-shape". In a preferred embodiment, the dipoles have equal angles and opposite bend directions.

The primary purpose of the dipoles is to convert a plurality of divergent rays or beamlets originating from the scan vertex 246 into a plurality of substantially parallel rays or beamlets having the form of a relatively thin, elongated ribbon shaped beam. The use of two symmetric dipoles, as illustrated herein, results in symmetrical properties across the ribbon shaped beam in terms of beamlet path length and first and higher order focusing properties. Furthermore, similar to the operation of the mass analyzer 226, the s-shaped bend serves to filter and decontaminate the ion beam 212. In particular, the trajectories of neutral particles and/or other contaminants (e.g., environmental particles) that enter the ion beam 212 downstream of the mass analyzer 226 are not generally affected by (or are affected very little by) the dipoles, such that these particles continue traveling along the original beam path, whereby a relatively large quantity of these neutral particles that do not get bent or get bent very little thus do not impact the workpiece 222 (e.g., the workpiece is positioned to receive the bent ion beam 212). It can be appreciated that it is important to remove such contaminants from the ion beam 212 as they may possess an incorrect charge, and/or energies etc. Generally, such contaminants would not be affected (or are affected to a much lesser degree) by deceleration and/or other stages in the system 200. As such, they can have a significant (albeit unintended and generally undesirable) impact upon the workpiece 222 in terms of dose, energy and angle uniformity. This can, in turn, produce unanticipated and undesirable resultant device performance.

Downstream of the parallelization component 230, one or more deceleration stages 232 are provided. Examples of deceleration and/or acceleration systems are demonstrated by U.S. Pat. No. 5,091,655 to Dykstra et al. U.S. Pat. No. 6,441,382 to Huang and U.S. Pat. No. 8,124,946 to Farley et al., the entirety of which are hereby incorporated herein by reference. As previously indicated, up to this point in the system 200, the beam 212 is generally transported at a relatively high energy level to mitigate the propensity for beam blow-up, which can be particularly high where beam density is elevated such as at a resolving aperture 236, for example. Similar to the ion extraction assembly 214, scanning element 238 and focusing and steering element 240, the deceleration stage 232 comprises one or more electrodes 232a, 232b operable to decelerate the beam 212.

It will be appreciated that while two electrodes 220a and 220b, 238a and 238b, 240a and 240b and 232a and 232b are respectively illustrated in the exemplary ion extraction assembly 214, scanning element 238, focusing and steering element 240 and deceleration stage 232, these elements 214, 238, 240 and 232 may comprise any suitable number of electrodes arranged and biased to accelerate and/or decelerate ions, as well as to focus, bend, deflect, converge, diverge, scan, parallelize and/or decontaminate the ion beam 212 such as provided in U.S. Pat. No. 6,777,696 to Rathmell et al., the entirety of which is hereby incorporated herein by reference. Additionally, the focusing and steering element 240 may comprise electrostatic deflection plates (e.g., one or more pairs thereof), as well as an Einzel lens, quadrupoles and/or other focusing elements to focus the ion beam. Although not necessary, it can be advantageous to apply voltages to the deflecting plates within the steering and focusing element 240 so that they average to zero, the effect of which is to avoid having to introduce an additional Einzel lens to mitigate the distortion of the focusing aspect of element 240. It will be appreciated that "steering" the ion beam 212 is a function of the dimensions of plates 240a, 240b and the steering voltages applied thereto, among other things, as the beam direction is proportional to the steering voltages and the length of the plates, and inversely proportional to the beam energy.

Figure 4:
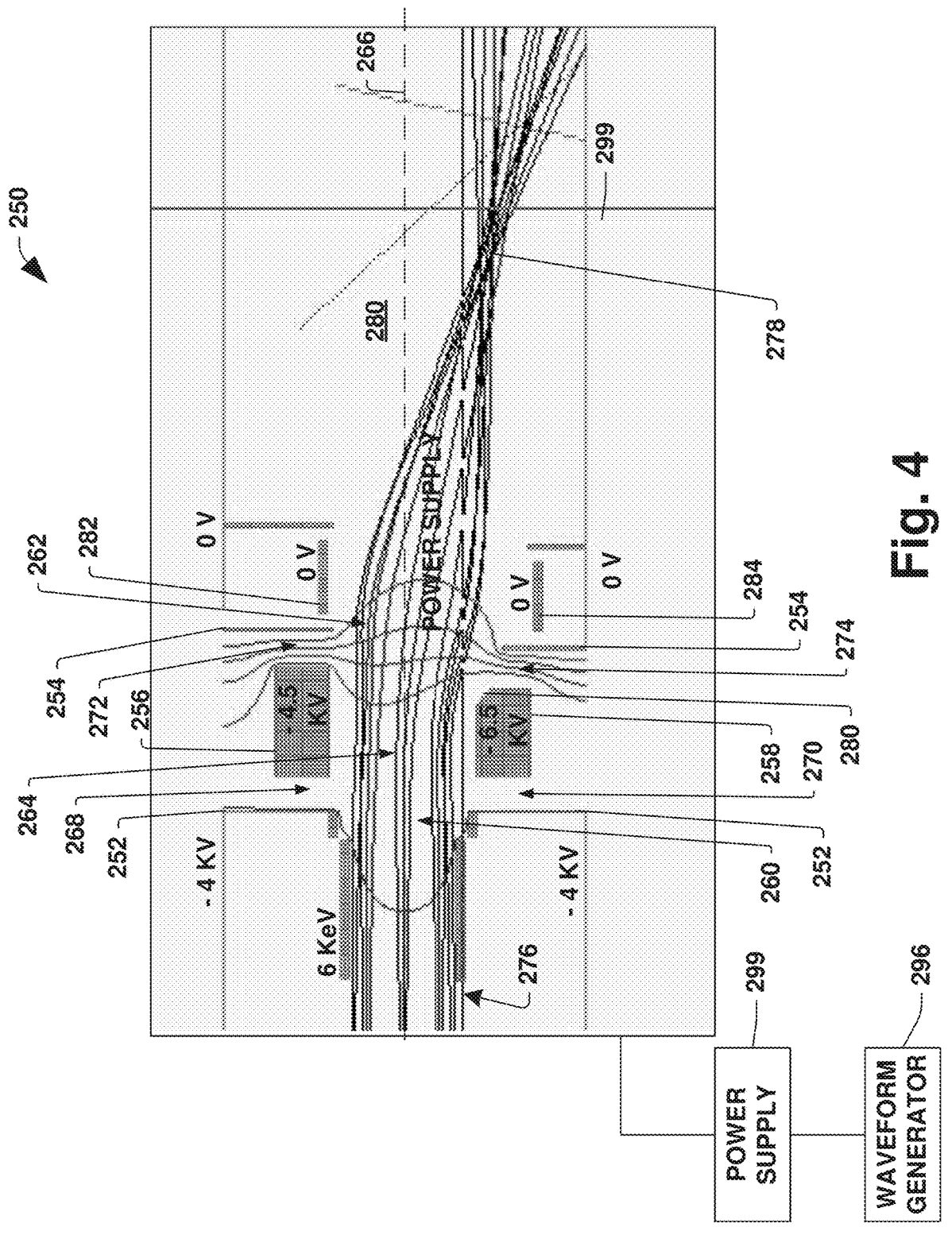
FIG. 4 illustrates a portion of an ion beam in an ion implantation system in accordance with several aspects of the present disclosure.

FIG. 4 illustrates an exemplary acceleration/deceleration stage 232 in accordance with one or more aspects of the present disclosure is illustrated in greater detail as an electrode column 250, which includes first and second electrodes 254 and 254 and a pair of intermediate electrode plates 256 and 258. The first and second electrodes 252 and 254 are substantially parallel to one another and define first and second apertures 260 and 262, respectively. A gap 264 is defined between the apertures 260, 262 and the electrodes 252, 254 are arranged such that an axis 266 substantially normal to the first and second electrodes 252, 254 runs through the gap 264 and through the first and second apertures 260, 262. The intermediate electrode plates comprise an upper mid-gap electrode 256 and a lower mid-gap electrode 258. A first upper sub-gap area 268 is defined between the first electrode 252 and the upper mid-gap electrode 256. A first lower sub-gap area 270 is defined between the first electrode 252 and the lower mid-gap electrode 258. Similarly, a second upper sub-gap area 272 is defined between the second electrode 254 and the upper mid-gap electrode 256, and a second lower sub-gap area 274 is defined between the second electrode 254 and the lower mid-gap electrode 258. An ion beam 276 passes through the gap 264 and is deflected from the axis 266, such as by about 12 degrees, for example, and is focused at a point 278 downstream from the gap 264. The present disclosure further incorporates by reference the contents of co-owned U.S. Pat. No. 9,218,941 to Jen et al. in its entirety, herein.

In the illustrated example, particular biases are depicted to facilitate a discussion of the operation of the electrode column 250 that make up the exemplary deceleration/acceleration stage 232. It will be appreciated, however, that, for purposes of the present disclosure, any suitable electrical biases may be applied among the electrodes to achieve desired results (e.g., a degree of acceleration, deceleration, and/or deflection). Indeed, in the context of the present disclosure wherein continuously controlled variable ion beam energy is the desired result, it will be understood that variation of the electrical bias signals applied to these electrodes will be essential, whether this involves variations to voltages applied to the electrodes or currents therethrough. The bias values in FIG. 4 are, however, effective to demonstrate deceleration of the ion beam 276.

The ion beam 276, and more particularly the positive ions contained therein, enter the gap 264 through the first aperture 260 with an initial energy level (e.g., 6 KeV in the example illustrated). In order to accelerate or decelerate the ions in the beam, the first and second electrodes 252 and 254 are biased differently so that a difference in potential exists therebetween and the ions experience a corresponding increase or decrease in energy as they pass through the gap 264 between the first and second electrodes 252, 254. For instance, in the example presented in FIG. 4, the positive ions of the ion beam experience an energy drop of 4 KeV as they pass from the first electrode 252 which has a negative 4 KV bias to the second electrode 254 which has zero potential (e.g., is coupled to ground). Thus, the original ion beam energy of positive 6 KeV is reduced to 2 KeV as the ions pass through the gap 264 and experience a 4 KeV energy drop. The ion beam 276 will therefore have a particular resulting energy level (e.g., 2 KeV in the example illustrated) once it exits the gap 264 and enters a neutral zone downstream from the gap 264.

It will be appreciated that this is true regardless of the path the ions may have taken to get through the gap 264. For instance, in the example illustrated, ions entering the lower sub-gap 270 between the first electrode 252 and the lower mid-gap electrode 258 will be accelerated at a rate greater than the rate at which ions entering the upper sub-gap 268 between the first electrode 252 and the upper mid-gap electrode 256 will be accelerated. This is because there is a greater difference in potential between the first electrode 252 and the lower mid-gap electrode 258 than there is between the first electrode 252 and the upper mid-gap electrode 256 (e.g., negative 2.5 KV for the lower sub-gap 270 (negative 4 KV minus negative 6.5 KV)) and negative 0.5 KV for the upper sub-gap 268 (negative 4 KV minus negative 4.5 KV)).

This difference in acceleration is, however, offset by a corresponding difference in potential between the upper 256 and lower 258 mid-gap electrodes and the second electrode 254. For instance, in the example illustrated, the second electrode 254 is biased to zero (e.g., coupled to ground). Thus, the ions coming from the first lower sub-gap 270 are decelerated to a greater degree than the ions coming from the first upper sub-gap 268. This offsets the differences in acceleration of the ions as they enter the gap such that as the ions exit the gap they all possess substantially the same energy (e.g., 2 KeV). The ions coming from the first lower sub-gap 270 will be decelerated to a greater degree because they will have to traverse the negative 6.5 KV while crossing the second lower sub-gap 274 (e.g., the negative 6.5 KV bias of the lower mid-gap electrode 258 minus the zero V bias of the second electrode 254). By contrast, the ions coming from the first upper sub-gap 268 will be decelerated to a lesser degree because they will merely have to traverse the negative 4.5 KV while crossing the second upper sub-gap 272 (e.g., the negative 4.5 KV bias of the upper mid-gap electrode 614 minus the zero V bias of the second electrode 254). Accordingly, regardless of the different paths the ions take and the energy levels through which the ions pass, substantially all of the ions emerge from the effects of the gap at substantially the same energy level (e.g., 2 KeV).

It will be appreciated that the upper and lower mid-gap electrodes 256, 258 serve the dual purpose of pulling the ion beam into the gap 264 to accelerate or decelerate the ion beam, and to provide beam deflection or bending for beam filtering purposes. For example, the mid-gap plates 256, 258 are generally differentially biased relative to one another so that an electrostatic field is developed therebetween to bend or deflect the beam either up or down, or with varying magnitude, depending upon the magnitude of the biasing of the electrodes and relative to the energy of the ion beam. In the example featured, for instance, the upper and lower mid-gap electrodes 256, 258 are biased to negative 4.5 KV and negative 6.5 KV, respectively. Presuming the beam comprises positively charged ions, this difference in potential causes the positively charged ions passing through the gap 264 to be forced downward toward the more negatively charged lower mid-gap electrode 258, ultimately causing the beam 276 to bend or deflect downward (e.g., by about 12 degrees). Bending or deflecting the ions in this manner has the effect of filtering neutral particles from the beam, which are not influenced by the electric field through which the ion beam passes, and also filtering ions that are may not be at substantially the same energy as the ions to be implanted.

It will be understood that in order to maintain this exemplary 12 degree deflection in view of a varying energy beam, the bias applied to the mid-gap electrodes 256, 258 must also be varied in a corresponding manner. For example, acceleration of an ion beam can be induced by biasing electrodes 282, 284 to negative 4 KV while biasing electrodes 252, 254 to positive 40 KV, although any biasing value(s) are contemplated. This biasing arrangement creates a negative potential barrier which extends out into the neutral zone. It will be appreciated that with these bias voltages applied the operation of the device is substantially similar to that described, with the exception that the beam 276 is accelerated rather than decelerated. These exemplary values serve to increase the energy level of the beam from, for example 80 KeV to 120 KeV, accelerating the beam by a factor of 1.5, wherein positive ions in the beam 276 will be accelerated as the ions traverse the second upper sub-gap area 272 and the second lower sub-gap area 274.

It will be appreciated that the arrangement, configuration and/or shaping of the upper 256 and lower 258 mid-gap electrodes can be tailored to facilitate control over the lensing, focusing, deflection and/or acceleration/deceleration effect on the beam. By way of example, in the illustration depicted in FIG. 4, the lower mid-gap electrode 258 has a slightly reduced width relative to that of the upper mid-gap electrode 256 and also possesses a slightly beveled corner 280. These adjustments essentially counter the increased lensing effects that the ions near the lower mid-gap electrode 258 experience as they undergo stronger acceleration and/or deceleration due to differences in applied biases. It will be appreciated, however, that for purposes of the present disclosure these electrodes 256, 258 can have any suitable configurations, including identical shapes. It will be further appreciated that the beam may or may not be bent or deflected in acceleration, deceleration and/or drift (e.g., zero accel/decel) modes because the upper and lower mid-gap electrodes 256, 258, which are predominately responsible for beam bending, operate substantially independently of the first and second electrodes 252, 254, which are predominantly responsible for the acceleration/deceleration of the beam 276. For example, the upper and lower mid-gap electrodes can be biased to identical voltages such that acceleration or deceleration can be induced without bending the ion beam 276.

The overall net effect of all of the differences in potential is focusing, deceleration (or acceleration) and optional deflecting of ions in the beam 276. Deflection of the ion beam provides energy decontamination as neutral particles in the beam, which are undeterred by the effects of the electrodes, continue along the original beam path parallel to the axis 266. The contaminants may then, for example, encounter some type of barrier or absorbing structure (not shown), which halts their forward progress and shields any workpiece from the contaminants. By contrast, the trajectory of the deflected ion beam 276 causes the beam to appropriately encounter and dope select areas of the workpiece (not shown).

It will be appreciated that the arrangement of the electrodes (e.g., the upper and lower mid-gap electrodes 256, 258 intermediate the first and second electrodes 252, 254) also serves to mitigate beam blow up as this configuration minimizes the distance the beam 276 has to travel before encountering the wafer. By having the beam 276 be accelerated, decelerated, or deflected (e.g., by the upper and lower mid-gap electrodes 256, 258) while concurrently having the beam be focused (e.g., by the first and second electrodes 252, 254), rather than having these bending and focusing stages arranged serially, the end station can be situated closer to the accelerator/decelerator stage of the ion implantation system.

In the illustrated example(s), particular electrical biases are applied to electrodes and are depicted to facilitate a better understanding of the operation of the deceleration stage 232 of FIG. 3. It will be appreciated, however, that, for purposes of the present disclosure, any suitable voltages or currents may be applied among the electrodes to achieve desired results, such as degree of acceleration, deceleration, and/or deflection, if any. In addition, for the purposes of the present disclosure, magnets and electrical currents therethrough may be utilized to achieve these desired results. Moreover, the particular biases are applied in a selectively and continuously variable and controlled manner in order to achieve the selective and variable energy control of the present disclosure. The illustrated bias values in FIG. 4 are, however, effective to demonstrate deceleration of the ion beam 276.

It should be noted that the selective variation of the bias voltage can be further based on one or more predetermined characteristics provided by one of an operator and a characterization of the workpiece 222 of FIG. 3, for example, and can be iterative. For example, a "chain implant" can be performed, wherein a discrete number of implants having variable energies are provided to the workpiece 222 in either a predetermined sequential order, or in a randomized manner. The predetermined sequential order of the chain implant, for example, can begin at a low energy and sequence through a set of predetermined energies in a specific order from the low energy to a high energy. In another example, the predetermined sequential order of the chain implant can begin at a high energy and sequence through a set of predetermined energies in a specific order from the high energy to a low energy. In yet another example, the chain implant can begin at any given energy and sequence through a set of predetermined energies in any specified or randomized order. Each "chain", for example, can be predetermined through a metrology map of the workpiece 222 prior to implantation. In addition, each step of the chain can be programmed into the control system of the ion implanter as a plurality of sequential steps prior to initiation of the implant chain.

Thus, the overall effect is a continuously controlled variable doping depth profile across the workpiece 222 that is either uniform or non-uniform, thus defining an energy patterned implant. For example, chains of differing energies may be iteratively performed, wherein the dose and doping depth profile across the workpiece provided in each step of the chain results in a substantially uniform implant profile. Alternatively, topographic feedback can be utilized to selectively vary the bias voltage concurrent with the implantation and/or among a chain or a plurality of chain implants.

It shall be appreciated that different types of end stations 206 may be employed in the implanter system 200. For example, a "batch" type end station can simultaneously support multiple workpieces 222 on a rotating support structure, wherein the workpieces 222 are rotated through the path of the ion beam until all the workpieces are completely implanted. A "serial" type end station, on the other hand, supports a single workpiece 222 along the beam path for implantation, wherein multiple workpieces 222 are implanted one at a time in serial fashion, with each workpiece 222 being completely implanted before implantation of the next workpiece 222 begins. In hybrid systems the workpiece 222 may be mechanically translated in a first (Y or slow scan) direction while the beam is electrically or magnetically scanned in a second (X or fast scan) direction to impart the beam 212 over the entire workpiece 222, as disclosed, for example, in commonly assigned U.S. Pat. No.

9,443,698, incorporated in its entirety by reference herein. By contrast, in a so-called two-dimensional mechanical scan architecture as is known in the art and exemplified by the Optima HD™ Ion Implantation System manufactured and sold by Axcelis Technologies, Inc. of Beverly, Mass., the workpiece 222 may be mechanically translated in front of a fixed position ion beam, in a first (slow) scan direction while the workpiece is simultaneously scanned in a second, substantially orthogonal, (fast) scan direction to impart the beam 212 over the entire workpiece 222. In addition, in a so-called ribbon beam system, the ion beam can be transported along the beamline in a manner such that the beam has a lengthwise dimension that that is greater than the workpiece such that only the workpiece is scanned in a direction transverse to the lengthwise dimension of the beam for implanting ion across the entire surface of the workpiece.

The end station 206 in the illustrated example is a "serial" type end station that supports a single workpiece 222 along the beam path for implantation. A dosimetry system 286 is included in the end station 206 near the workpiece location for calibration measurements prior to implantation operations. During calibration, the beam 212 passes through dosimetry system 286. The dosimetry system 286 includes one or more profilers 288 that may continuously traverse a profiler path 290, thereby measuring the profile of the scanned beams. The profiler 288 may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution. Measurement of beam angles can use a moving profiler sensing current behind a mask with slots as described in the literature. The displacement of each individual beamlet from the slot position after a short drift can be used to calculate the beamlet angle. It will be appreciated that this displacement may be referred to as a calibrated reference of beam diagnostics in the system.

The dosimetry system 286 is operably coupled to a control system 292 to receive command signals therefrom and to provide measurement values thereto. For example, the control system 292, which may comprise a computer, microprocessor, etc., may be operable to take measurement values from the dosimetry system 286 and calculate an average angle distribution of the scanned ribbon beam across the workpiece. The control system 292 is likewise operatively coupled to the terminal 202 from which the beam of ions is generated, as well as the mass analyzer 226 of the beamline assembly 204, the scanning element 238 (e.g., via power supply 242), the focusing and steering element 240 (e.g., via power supply 244), the parallelizer 230 and the acceleration/deceleration stage 232. Accordingly, any of these elements can be adjusted by the control system 292 to facilitate desired ion implantation parameters based upon values provided by the dosimetry system 286 or any other ion beam measuring or monitoring device. Control signals can also be generated via look up tables that are stored into memory modules, typically based on empirical data collected through experimentation.

As one example, the ion beam can initially be established according to predetermined beam tuning parameters (e.g., stored/loaded into the control system 292). Then, based upon feedback from the dosimetry system 286, the scanner 238 can be adjusted to alter the scan speed of the scanned beam to vary the ion dose on the workpiece. Similarly, the acceleration/deceleration stage 232 and/or the ion extraction assembly can be adjusted to alter the energy level of the beam to adjust junction depths by adjusting the bias applied to electrodes in the ion extraction assembly 214 and/or the deceleration stage 232, for example. Correspondingly, the strength and orientation of magnetic or electric field(s) generated in the scanner can be adjusted, such as by regulating the bias voltages applied to the scan electrodes, for example. The angle of implantation can be further controlled by adjusting the voltage applied to the steering element 240, or the acceleration/deceleration stage 232, for example.

In accordance with one aspect of the disclosure, a control system 292 is provided and configured to establish a predetermined scan pattern on the workpiece 222, wherein the workpiece is exposed to the spot ion or pencil beam by means of control of the scanning system 228. The control system 292, for example, is configured to control various properties of the ion beam, such as the beam density and current of the ion beam, as well as other properties associated with the ion beam, specifically energy thereof. Further, the controller 292 is configured to control a speed of scanning of the workpiece 222 positioned on a workpiece support 294. While not shown, the workpiece support 294, for example, is operably coupled to a translation mechanism (e.g., a robotic apparatus or other apparatus) configured to translate the workpiece 222 residing on the workpiece support through the ion beam 212.

Further, in the context of the present disclosure for providing a continuously controlled variable energy ion beam in the ion implantation system 200, the control system 292 is configured to modify and adjust electrical bias signals 295 applied to various subsystems. For example, the control system 292 is configured to control electrical bias signals 295 supplied to the deceleration/acceleration stage 232 by further controlling one or more waveform generators 296 providing one or more waveforms 298 to one or more variable power sources 299, whereby an energy of the ion beam 212 in the ion implantation system is based on the one or more waveforms applied to the various of the electrodes illustrated herein.

With respect to the exemplary ion implantation system 200 described herein, the control system 292 can be configured to modify and vary the scan voltage applied to the scanner 228 and can be further configured to modify and vary, in synchronism with the scan voltage, the bias voltage applied to the acceleration/deceleration stage 232 based on the waveform, for correspondingly adjusting the energy and deflection of the ion beam. Such modification of the scan voltage and bias voltage, for example, can be implemented in discrete steps or in a continuous manner (e.g., not discrete) without removing the workpiece from the platen or processing environment, thus providing various advantages over known systems and methodologies.

It will also be understood that the present disclosure can be combined with features known in the art to provide even greater variability of the ion implantation process during ion implantation. The features of the present disclosure for providing continuously variable energy control of an implant process could be combined with other features for providing variable dose control of an ion implant process to achieve variable energy and dose ion implants across the surface of the wafer.

Likewise, it may be desirable to provide ions of different charge states for varying the beam current at a given kinetic energy of the beam. The present disclosure for providing continuously variable energy control of an implant process could be combined with the features for providing variable charge states of an ion implant process to achieve variable energy and/or variable dose ion implants across the surface of the workpiece. Similarly, it may be desirable to provide workpieces at temperatures either below or above ambient temperature in order to achieve certain desired results. Thus, the present disclosure for providing continuously variable energy control of an implant process could be combined with features for providing low or high temperature workpieces in an ion implant process to achieve variable energy ion implants across the surface of the wafer.

Figure 5:
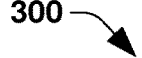
FIG. 5 illustrates a method for optimizing an implantation of ions into a workpiece in accordance with various aspects of the present disclosure.
Figure 5:
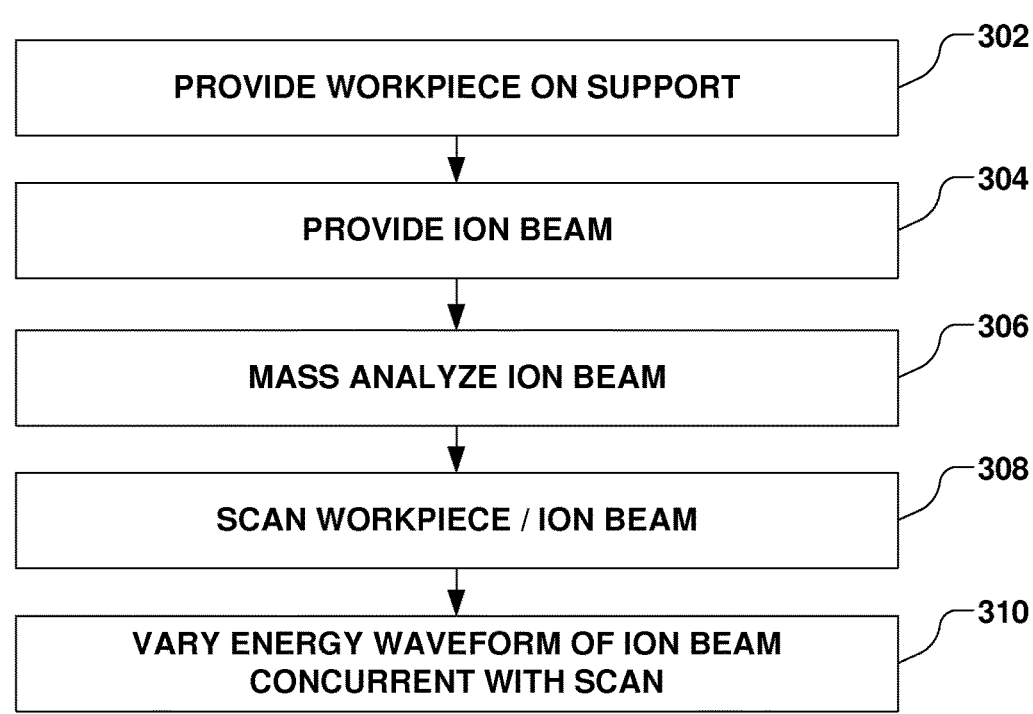

In accordance with the present disclosure, the system described herein enables a method 300 for implanting ions at varying depths, as illustrated in FIG. 5. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 of FIG. 5 begins at act 302 with providing a workpiece on a support. In act 304, an ion beam, such as spot ion beam, is provided, and in act 306, the ion beam is mass analyzed. In act 308, one or more of the workpiece and ion beam may be scanned with respect to the other. For example, the workpiece is mechanically scanned in two orthogonal directions in act 308. In another alternative, the ion beam is electrostatically or magnetically scanned in a first direction, and mechanically scanned in a second direction. In yet another alternative, the ion beam is electrostatically scanned in two non-parallel directions.

In act 310, an energy of the ion beam is selectively varied concurrent with the scanning of act 308 in a continuous manner in a predetermined waveform as the ion beam is scanned across the workpiece. Accordingly, a resultant depth of implantation of ions into the workpiece is varied along a surface of the workpiece.

Thus, the present disclosure is directed to an ion implantation system and method for varying the energy of the ion beam as it travels across the workpiece or vice versa. The present disclosure is enabled by varying the electrical bias applied to accel/decel electrodes so that the energy of the ions delivered to a workpiece can be continuously varied to achieve a predetermined variable energy ion implant depth at the workpiece based on a predetermined set of electrical bias signals provided to the accel/decel electrodes or the waveform discussed above. In a preferred embodiment, the present disclosure would provide a continuously controlled variable energy pattern in a response to a continuous function mapped across the workpiece and/or mapped into a matrix, which can be used to program the energy of the beam as a function of location across the workpiece. For example, the present disclosure can be carried out by creating a spatial map in memory, where each cell of that memory location corresponds to a unique energy with respect to an x and y position on the workpiece. It will be understood that the present disclosure could be incorporated in a system for providing variable energy implantation in the form of a continuously variable energy, or in the form of step function changes in energy or otherwise. Variation in the energy profile across the surface of the workpiece could be symmetrical, and could also be in quadrants or otherwise, such as $X_1$ energy in specified location $Q_1$, $X_2$ energy in $Q_2$, etc.

The exemplary ion implantation system architecture described herein for illustration purposes is particularly well suited for enabling continuous variation in ion beam energy across the surface of a workpiece in that the system 200 of FIG. 3 incorporates a scanned spot beam, where in the beam is scanned electronically or magnetically across the surface of the workpiece. This scanning of a spot beam permits modulation or variation of the ion beam energy as the beam is scanned. Thus, as the beam is scanned to strike selected positions on the wafer, it goes through all its optical elements of the beamline wherein the beam can be modified to change its energy to a selected energy prior to striking the wafer. Advantageously, changes in the beam energy can be can be accomplished in synchronism with the x and y scanning functions of the scanner and/or end station such that the energy of the scanned beam can be varied as a function of x and y. Advantageously, in the exemplary ion implantation system described herein, the final beam energy can be varied by biasing voltages applied to a single downstream component, the decel/accel stage 232, thereby eliminating arduous and complicated tuning requirements required when modifying electrical biases in upstream components that can vary ion energies, such as the extraction electrodes 214 situated immediately downstream of the ion source 208, but would then affect biasing of other components downstream therefrom in order to maintain the desired integrity and characteristics of the on beam. In addition, the biasing voltages applied to the acceleration/deceleration forced and the deflecting energy filter aspect thereof can be varied as a function of the x and y position of the scanned beam such that the beam can be constrained to travel on the same path to the wafer, independent of the variation of energy of the ion beam.

It will be understood that all of the selective biasing of components and subsystems can be accomplished via control system 292 and can be implemented via a feedback loop input to the acceleration/deceleration stage, as well as the energy filter, based on the location of the beam output from the scanning system. It will be understood, however, that a feedback loop is not a requirement for enabling the continuously controlled variable energy ion implantation features of the present disclosure, as preprogrammed ion beam energy profiles can also be advantageously implemented to execute the selectively variable energy ion implantation of the present disclosure. As such, ion beam energy can be selectively varied per die, or some other feature or region, either via a feedback loop for the x,y coordinate position of the beam on the wafer, or via some predetermined desired pattern.

The continuously controlled variable energy ion implantation of the present disclosure can also be implemented through a map of the workpiece, wherein the continuous and controlled variation of the one or more voltages respectively supplied to one or more of the electrodes in the electrode column and/or the energy filter is based on a map of a workpiece positioned on the workpiece support. In another alternative, the ion implantation system of the present disclosure can be provided with a detector (e.g., an optical detector, camera, or the like), or multiple detectors configured to detect one or more properties of a workpiece positioned on the workpiece support, wherein the continuous variation of the one or more voltages respectively supplied to one or more of the electrode column of the acceleration/deceleration stage and/or the energy filter is further based on feedback from the detector. In accordance with this alternative embodiment, the detector or detectors may be preferably configured to detect one or more of a thickness of the workpiece, a thickness of a layer disposed on the workpiece, a die pattern on the workpiece, an edge of the workpiece, a center of the workpiece, or a predefined region on the workpiece, wherein the detected information is provided as input to continuously vary the energy of the ion beam.

Although the invention has been illustrated and described with respect to one or more implementations, it will be understood that alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including any reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for ion implantation, the method comprising:
directing an ion beam toward a workpiece;
scanning one or more of the ion beam and the workpiece with respect to one another, thereby implanting ions into the workpiece; and
selectively varying an energy of the ion beam concurrent with the scanning of the one or more of the ion beam and the workpiece based, at least in part, on a position of the ion beam with respect to the workpiece and a predetermined implant profile across the workpiece, wherein a resultant depth of implantation of ions into the workpiece is varied concurrent with the scanning.

2. The method of claim 1, wherein selectively varying the energy of the ion beam comprises varying an electrical bias to an electrode positioned along a path of the ion beam based on a waveform.

3. The method of claim 2, wherein varying the electrical bias to the electrode defines a final energy of the ions at the workpiece.

4. The method of claim 2, wherein the electrode comprises one or more of an ion beam accelerator electrode, an ion beam decelerator electrode, and a bend electrode.

5. The method of claim 4, wherein selectively varying the energy of the ion beam further comprises varying the electrical bias to the bend electrode, wherein the bend electrode is configured to angularly deflect the ion beam, and wherein the variation of the electrical bias to the bend electrode is synchronized with varying the electrical bias to the ion beam accelerator electrode or to the ion beam decelerator electrode.

6. The method of claim 1, wherein the predetermined implant profile is defined across an entire surface of the workpiece.

7. The method of claim 6, further comprising pre-tuning one or more components defining the ion beam for a plurality of recipes for the implantation of ions into the workpiece prior to scanning the one or more of the ion beam and the workpiece with respect to one another.

8. The method of claim 1, further comprising pre-tuning one or more components defining the ion beam in accordance with a plurality of recipes for the implantation of ions into the workpiece prior to the scanning of the one or more of the ion beam and the workpiece with respect to one another.

9. The method of claim 2, wherein varying the electrical bias is based, at least in part, on a waveform applied to the electrical bias, and wherein the predetermined implant profile is generally defined by the waveform.

10. The method of claim 9, further comprising generating the waveform with a waveform generator.

11. The method of claim 2, further comprising selectively varying the waveform.

12. The method of claim 2, further comprising synchronizing the waveform with the scanning of the one or more of the ion beam and the workpiece with respect to one another.

13. The method of claim 1, wherein scanning the one or more of the ion beam and the workpiece with respect to one another comprises:
    scanning the ion beam along a first scan axis at a first frequency; and
    scanning the workpiece along a second scan axis at a second frequency, wherein the first frequency is at least an order of magnitude greater than the second frequency.

14. The method of claim 13, wherein selectively varying the energy of the ion beam comprises varying an electrical bias to an electrode positioned along a path of the ion beam at a third frequency, wherein the third frequency is at least an order of magnitude greater than the first frequency.

15. An ion implantation system comprising:
    an ion source configured to ionize a dopant material and to generate an ion beam;
    a beamline assembly positioned downstream of the ion source and configured to transport the ion beam toward a workpiece;
    a scanning apparatus configured to scan one or more of the ion beam and the workpiece with respect to one another along a first scan axis;
    an acceleration/deceleration stage configured to receive the ion beam during transport thereof;
    an end station positioned downstream of the acceleration/deceleration stage, wherein the end station comprises a workpiece support configured to selectively position the workpiece in a path of the ion beam;
    one or more power sources operably coupled to the acceleration/deceleration stage and configured to provide one or more electrical bias signals thereto; and
    a controller configured to selectively vary the one or more electrical bias signals concurrent with the scanning of the one or more of the ion beam and workpiece based, at least in part, on a position of the ion beam with respect to the workpiece and a predetermined implant profile across the workpiece, wherein selectively varying the one or more electrical bias signals selectively varies a resultant depth of implantation of ions into the workpiece concurrent with the scanning.

16. The ion implantation system of claim 15, wherein the selective variation of the one or more electrical bias signals is further based, at least in part, on a waveform applied to the one or more electrical bias signals, and wherein the predetermined implant profile is generally defined by the waveform.

17. The ion implantation system of claim 16, further comprising a waveform generator configured to generate the waveform.

18. The ion implantation system of claim 17, wherein the waveform generator is operably coupled to the one or more power sources and configured to selectively apply the waveform thereto to generate the one or more electrical bias signals.

19. The ion implantation system of claim 17, wherein the waveform generator is operably coupled to the controller and configured to continuously vary the one or more electrical bias signals supplied to the acceleration/deceleration stage concurrent with the scanning of the one or more of the ion beam and the workpiece along the first scan axis.

20. The ion implantation system of claim 15, wherein the scanning apparatus is configured to reciprocally scan the one or more of the ion beam and the workpiece with respect to one another along the first scan axis at a first scanning frequency, and wherein the controller is configured selectively vary the one or more electrical bias signals at a bias variation frequency that is greater than the first scanning frequency.

21. The ion implantation system of claim 20, wherein the bias variation frequency is at least an order of magnitude greater than the first scanning frequency.

22. The ion implantation system of claim 15, wherein the scanning apparatus is further configured to scan one or more of the ion beam and the workpiece support with respect to one another along a second scan axis that is non-parallel to the first scan axis.

23. The ion implantation system of claim 22, wherein the scanning apparatus comprises one or more of an electrostatic and a magnetic scanner configured to respectively electrostatically and magnetically scan the ion beam along at least the first scan axis.

24. The ion implantation system of claim 23, wherein the scanning apparatus further comprises a mechanical scanning apparatus configured to mechanically scan the workpiece support along the second scan axis.

25. The ion implantation system of claim 22, wherein the first scan axis is orthogonal to the second scan axis.

26. The ion implantation system of claim 22, wherein the scanning apparatus comprises a mechanical scanning apparatus configured to mechanically scan the workpiece support along the first scan axis and the second scan axis.

27. The ion implantation system of claim 15, wherein the one or more power sources comprise one or more selectively variable power supplies, and wherein the one or more electrical bias signals comprise one or more of a voltage and a current.

28. The ion implantation system of claim 15, wherein the selective variation of the one or more electrical bias signals is further based on one or more predetermined characteristics provided by one of an operator and a characterization of the workpiece.

29. The ion implantation system of claim 15, wherein the predetermined implant profile comprises a predetermined dopant energy distribution across an entirety of the workpiece.

30. The ion implantation system of claim 15, wherein the selective variation of the one or more electrical bias signals

29

30 is further based on feedback from the scanning apparatus corresponding to the position of the ion beam with respect to the workpiece.

31. The ion implantation system of claim 15, wherein the selective variation of the one or more electrical bias signals comprises a predetermined sequence of a plurality of electrical bias signals.

32. The ion implantation system of claim 15, wherein the selective variation of the one or more electrical bias signals is randomized.

33. The ion implantation system of claim 15, wherein the acceleration/deceleration stage comprises an electrode column having one or more electrode pairs, and wherein the one or more electrical bias signals are supplied to the one or more electrode pairs of the electrode column.

34. The ion implantation system of claim 33, wherein the electrode column comprises one or more of an ion beam accelerator, an ion beam decelerator, and a bend electrode.

35. The ion implantation system of claim 15, wherein the selective variation of the one or more electrical bias signals provides a uniform dose of ions over a predetermined energy range to an entirety of the workpiece.

36. The ion implantation system of claim 15, further comprising a detector configured to detect one or more workpiece properties associated with the workpiece positioned on the workpiece support, and wherein the selective variation of the one or more electrical bias signals is further based on feedback from the detector.

37. The ion implantation system of claim 36, wherein the detector comprises an optical detector, and wherein the one or more workpiece properties comprise one or more of a thickness of the workpiece, a thickness of a layer disposed on the workpiece, a die pattern on the workpiece, an edge of the workpiece, a center of the workpiece, and a predefined region on the workpiece.

38. The ion implantation system of claim 15, further comprising an energy filter comprising at least one bend electrode, wherein at least one of the one or more power sources is further operably coupled to the at least one bend electrode and configured to provide at least one of the one or more electrical bias signals thereto, and wherein the at least one bend electrode is configured to deflect the ion beam as a function of the one or more electrical bias signals provided to the acceleration/deceleration stage.

39. The ion implantation system of claim 15, wherein the controller is further configured to control one or more of the ion source, the beamline assembly, the scanning apparatus, the acceleration/deceleration stage, and the end station based on a plurality of implant recipes.

40. The ion implantation system of claim 39, wherein the controller is further configured to select one of the plurality of implant recipes based, at least in part, on the position of the ion beam with respect to the workpiece and the predetermined implant profile across the workpiece.

41. An ion implantation system, comprising:
an ion source configured to generate an ion beam;
an acceleration/deceleration stage configured to receive the ion beam to produce a final ion beam having a final energy associated therewith;
a workpiece support configured to selectively position a workpiece along a path of the final ion beam;
a scanning apparatus configured to scan one or more of the ion beam and workpiece support with respect to one another along a first scan axis and a second scan axis;
one or more power sources operably coupled to the acceleration/deceleration stage and configured to provide one or more electrical bias signals thereto;

a waveform generator operably coupled to one or more of the one or more power sources and configured to controllably apply a waveform to the one or more electrical bias signals; and
a controller operably coupled to the one or more power sources and the waveform generator and configured to selectively vary the one or more electrical bias signals supplied to the acceleration/deceleration stage concurrent with the scanning of the one or more of the ion beam and the workpiece support to implant a plurality of energies of the ion beam into the workpiece in a predetermined manner, wherein the selective variation of the one or more electrical bias signals supplied to the acceleration/deceleration stage is based, at least in part, on the waveform, a position of the ion beam with respect to the workpiece, and a predetermined implant profile across the workpiece, wherein a resultant depth of the implantation of ions into the workpiece is varied concurrent with the scanning.

42. The ion implantation system of claim 41, wherein the controller is configured to control the waveform generator to provide a predetermined energy of ions implanted across the workpiece.

43. The ion implantation system of claim 41, wherein the scanning apparatus is configured to scan the ion beam along the first scan axis at a first frequency, and wherein the scanning apparatus is further configured to scan the workpiece along the second scan axis at a second frequency, wherein the first frequency is at least an order of magnitude greater than the second frequency.

44. The ion implantation system of claim 43, wherein the selective variation of the one or more electrical bias signals supplied to the acceleration/deceleration stage is selectively varied at a third frequency, wherein the third frequency is at least an order of magnitude greater than the first frequency.

45. The ion implantation system of claim 41, wherein one or more of the ion source, the deceleration/acceleration stage, the workpiece support, the scanning apparatus, the one or more power sources, and the waveform generator are pre-tuned for a plurality of implantation recipes.

46. The ion implantation system of claim 45, wherein the controller is further configured to select one of the plurality of implantation recipes based, at least in part, on the waveform, the position of the ion beam with respect to the workpiece, and a predetermined energy of ions implanted across the workpiece.

47. An ion implantation system, comprising:
an ion source configured to form an ion beam and to direct the ion beam toward a workpiece;
one or more beamline components configured to transport the ion beam along a beam path;
a scanner apparatus configured to selectively iteratively scan one or more of the ion beam and the workpiece along a first scan axis;
an acceleration/deceleration stage downstream of the scanner apparatus;
a power source configured to provide an electrical bias signal to the acceleration/deceleration stage; and
a controller configured to vary the electrical bias signal provided to the acceleration/deceleration stage from the power source as one or more of the ion beam and the workpiece is iteratively scanned along the first scan axis, thereby selectively varying a final energy of ions implanted into the workpiece along the first scan axis, wherein a resultant depth of implantation of ions into the workpiece is varied concurrent with the iterative scanning.

48. The ion implantation system of claim 47, wherein the controller is further configured to control one or more the ion source, the one or more beamline components, the scanner apparatus, and the acceleration/deceleration stage based on a plurality of implantation recipes.

49. The ion implantation system of claim 47, wherein the scanner apparatus is further configured to selectively traverse one or more of the ion beam and the workpiece along a second scan axis generally perpendicular to the first scan axis.

50. The ion implantation system of claim 49, wherein the scanner apparatus is configured to iteratively traverse the ion beam along the first scan axis at a first frequency to traverse the workpiece along the second scan axis at a second frequency, wherein the first frequency is at least an order of magnitude greater than the second frequency.

51. The ion implantation system of claim 50, wherein the electrical bias signal provided to the acceleration/deceleration stage is varied at a third frequency, wherein the third frequency is greater than the first frequency.

52. The ion implantation system of claim 47, wherein the electrical bias signal provided to the acceleration/deceleration stage is varied in a predetermined manner.

53. The ion implantation system of claim 52, wherein the electrical bias signal provided to the acceleration/deceleration stage is varied to provide a uniform implant of a plurality of energies across a surface of the workpiece.

54. The ion implantation system of claim 52, wherein the electrical bias signal provided to the acceleration/deceleration stage is varied to provide a predetermined pattern of a plurality of energies across a surface of the workpiece.

* * * * *